(12) United States Patent
Arai et al.

(10) Patent No.: US 7,034,504 B2
(45) Date of Patent: Apr. 25, 2006

(54) BATTERY STATUS MONITORING APPARATUS WHICH MONITORS INTERNAL BATTERY RESISTANCE, SATURATION POLARIZATION DETECTING METHOD AND DISCHARGEABLE CAPACITY DETECTING METHOD

(75) Inventors: Youichi Arai, Shizuoka (JP); Shuji Satake, Shizuoka (JP); Michito Enomoto, Shizuoka (JP); Tomohiro Kawaguchi, Shizuoka (JP); Ken Ito, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 192 days.

(21) Appl. No.: 10/436,139

(22) Filed: May 13, 2003

(65) Prior Publication Data

US 2003/0210056 A1    Nov. 13, 2003

(30) Foreign Application Priority Data

May 13, 2002  (JP) .............................. 2002-137820
Mar. 31, 2003  (JP) .............................. 2003-097467

(51) Int. Cl.
*H01M 10/44* (2006.01)

(52) U.S. Cl. .................................................. 320/132
(58) Field of Classification Search ................ 320/132, 320/149; 324/426, 430, 433
See application file for complete search history.

(56) References Cited

U.S. PATENT DOCUMENTS 5,281,919 A * 1/1994 Palanisamy ................. 324/427
5,864,237 A * 1/1999 Kawai et al. ............... 324/430

* cited by examiner

*Primary Examiner*—Edward H. Tso
(74) *Attorney, Agent, or Firm*—Armstrong, Kratz, Quintos, Hanson & Brooks, LLP

(57) ABSTRACT

A microcomputer monitors, on the basis of outputs from a current sensor and voltage sensor, a voltage drop due to an internal resistance when the drop in the terminal voltage due to polarization occurring during the discharge of a battery is saturated, and a dischargeable capacity of the battery corresponding to the value resulting when the saturated voltage drop of the terminal voltage is subtracted from the chargeable capacity of the battery. Such a configuration provide a battery status monitoring device capable of knowing the battery status correctly, a saturation polarization detecting method which is useful to know the charging state of the battery and a dischargeable capacity detecting method.

14 Claims, 12 Drawing Sheets

BATTERY STATUS MONITORING APPARATUS WHICH MONITORS INTERNAL BATTERY RESISTANCE, SATURATION POLARIZATION DETECTING METHOD AND DISCHARGEABLE CAPACITY DETECTING METHOD

BACKGROUND OF THE INVENTION

1. Field of the Invention

This invention relates to a battery status monitoring apparatus, a saturation polarization detecting method and a dischargeable capacity detecting method, and more particularly to a battery status monitoring apparatus for monitoring the state of a battery, a saturation polarization detecting method for detecting a saturation polarization indicative of a saturated value of a drop of the terminal voltage due to the polarization which occurs when the battery is discharged, and a dischargeable capacity detecting method for detecting a dischargeable capacity of the battery.

2. Description of the Related Art

Generally, when a current is discharged from a battery, a drop in the terminal voltage of the battery occurs. This voltage drop is attributable to an internal resistance of the battery. This voltage drop increases with deterioration of the battery. The increased voltage drop changes the dischargeable capacity of the battery. Therefore, to detect the voltage drop due to the internal resistance of the battery is very important in order to know the battery status.

For this purpose, conventionally, in a battery status monitoring apparatus mounted on the vehicle, the internal resistance was detected while a starter motor was driving, thereby knowing the battery status. Otherwise, the internal resistance was acquired at any optional time to know the battery status.

Meanwhile, the voltage drop due to the above internal resistance is classified into an IR loss (pure resistance, i.e. voltage drop due to an ohmic resistance) attributable to a battery structure and a voltage drop due to a polarized resistance component (activated polarization or concentration polarization) which is attributable to a chemical reaction.

The IR loss described above does not vary as long as the battery status does not change. On the other hand, the voltage drop due to the polarization increases in proportion to a discharged current or discharging time, but does not exceed a saturated value. Therefore, by monitoring the point where the voltage drop due to polarization is saturated, the point where the voltage drop due to the internal resistance becomes maximum can be monitored.

However, conventionally, the internal resistance was detected at the start, or any optional internal resistance was detected. The point when the polarization is saturated was not consciously monitored. Particularly, because the time while the discharged current flows at the start is very short, the internal resistance at the point when the polarization is not saturated was detected. Therefore, there is a problem that the battery status was not known correctly.

SUMMARY OF THE INVENTION

In view of the above problem, a first object of this invention is to provide a battery status monitoring apparatus capable of correctly knowing a battery status.

A second object of this invention is to provide a saturation polarization detecting method which is useful to know the charging state of the battery correctly.

A third object of this invention is to provide a dischargeable capacity detecting method.

In order to attain the first object, in accordance with this invention, there is provided a battery status monitoring device comprising:

an internal resistance monitoring means for monitoring a voltage drop due to an internal resistance when a drop in the terminal voltage due to polarization occurring during battery discharge is saturated.

In this configuration, the voltage drop due to the internal resistance when the voltage drop due to polarization becomes maximum can be known.

In accordance with this invention, there is also provided a battery status monitoring device comprising:

a dischargeable capacity monitoring means for monitoring a dischargeable capacity, which is obtained by subtracting a voltage drop due to an internal resistance when a drop in the terminal voltage due to polarization occurring during discharge of a battery is saturated from an open circuit voltage corresponding to a chargeable capacity of the battery.

Preferably, the internal resistance monitoring means monitors a sum of a voltage drop due to a pure resistance of the battery when a peak current is flowing during the battery discharge and a saturated value of the drop in the terminal voltage due to polarization.

In this configuration, the voltage drop due to the internal resistance when the voltage drop due to the pure resistance which is the internal resistance component other than the polarization becomes maximum during the battery discharge can be known.

Preferably, the dischargeable capacity monitoring means monitors the dischargeable capacity on the basis of a value which is obtained by subtracting, from the open circuit voltage, a voltage drop due to a pure resistance of the battery when a peak current is flowing during the battery discharge and a saturated value of the drop in the terminal voltage.

In this configuration, the dischargeable capacity when the voltage drop due to the pure resistance which is the internal resistance component other than the polarization becomes maximum during the battery discharge can be known.

In order to attain the second object, there is provided a method of detecting a saturation polarization representative of a saturated value of a drop in the terminal voltage due to polarization occurring during battery discharge, comprising the step of:

detecting the saturation polarization on the basis of an approximated equation of the terminal voltage for a discharge current, which is acquired from a discharge current and terminal voltage of the battery detected during a predetermined period in the battery discharge; and a pure resistance of the battery.

In this configuration, the saturation polarization can be detected on the basis of an approximated equation of the terminal voltage for a discharge current, which is acquired from a discharge current and terminal voltage of the battery detected during a predetermined period in the battery discharge actually made; and a pure resistance of the battery.

Preferably, the method of detecting a saturation polarization comprises the steps of:

differentiating a relationship between the approximated equation and the voltage drops by the pure resistance and by polarization with respect to the discharge current, thereby acquiring an equation of a change of the voltage drop due to polarization relative to the discharge current;

acquiring, from the equation of a change, the discharge current when the change becomes zero as a terminal voltage drop saturated current value of the battery; and substituting the discharge current thus acquired in the relationship to provide the voltage drop due to polarization to be detected as the saturation polarization.

In this configuration, the saturation polarization can be known noting that the voltage drop due to polarization becomes maximum or saturated when the change in the voltage drop for the discharge current.

Preferably, the method of detecting a saturation polarization comprises the steps of:

acquiring, from the approximated equation of the terminal voltage, the terminal voltage when the discharge current is zero, if the terminal voltage when the discharge current is zero is lower than an open circuit voltage when the battery discharge starts, differentiating a relationship between the approximated equation and the voltage drops by the pure resistance and by polarization with respect to the discharge current, thereby acquiring an equation of a change of the voltage drop due to polarization relative to the discharge current;

acquiring, from the equation of a change, a value of the discharge current when the change becomes zero as a terminal voltage drop saturated current value of the battery; and substituting the discharge current thus acquired in the relationship to provide the voltage drop due to polarization and adding, to the voltage drop, a difference between the terminal voltage when the discharge current is zero and the open circuit voltage when the battery discharge starts, thereby detecting the added value as the saturation polarization.

In this configuration, the saturation polarization can be known noting that the voltage drop due to polarization becomes maximum or saturated when the change in the voltage drop for the discharge current. Further, by adding a difference between the terminal voltage when the discharge current is zero and the open circuit voltage when the battery discharge starts, the saturation polarization can be correctly known even the battery is not in an equilibrium state when the battery discharge starts.

Preferably, in the relationship, the terminal voltage in the approximated equation is represented by a sum of the voltage drops due to the pure resistance and polarization. Therefore, the saturation polarization can be known from a simple relationship.

Preferably, the method of detecting a saturation polarization comprises the step of:

in the case of the battery discharge when charging polarization has occurred, acquiring the approximated equation of the terminal voltage relative to the discharge current on the basis of the discharge current and terminal voltage detected during a predetermined period after a prescribed time elapses from when the battery discharge has started.

In this configuration, by acquiring the approximated equation of the terminal voltage for the discharge current from the discharge current and terminal voltage detected during a predetermined period after a prescribed time elapses from when the battery discharge has started, i.e. while charging polarization almost disappears, the discharging polarization can be known correctly.

In the battery status monitoring device, preferably, the internal resistance monitoring means detects the voltage drop due to the internal resistance acquired on the basis of the saturation polarization detected by the saturation polarization detecting method.

In this configuration, the voltage drop due to the internal resistance when the voltage drop is saturated can be known correctly.

In order to attain the third object of this invention, in accordance with this invention, there is provided a dischargeable capacity detecting method for detecting a dischargeable capacity of the battery using the saturation polarization of the battery detected by the saturation polarization detecting method according to claim 5, comprising the step of:

in each battery discharge, acquiring the dischargeable capacity on the basis of a value which is obtained by subtracting the voltage drop due to the pure resistance of the battery and the saturation polarization from the open circuit voltage when the battery discharge starts.

In this configuration, the voltage drop due to the pure resistance reflects the difference among the characteristics of individual batteries, and the present polarization of the battery reflects a decrease in the dischargeable capacity due to continues flowing of the discharge current and a change in the internal resistance to be attributed to a temperature change. Therefore, the dischargeable capacity free from the errors of the above difference among the characteristics and the above decrease in the dischargeable capacity can be known correctly.

There is also provided a dischargeable capacity detecting method for detecting a dischargeable capacity of the battery using the saturation polarization of the battery detected by the saturation polarization detecting method, comprising the step of:

in each battery discharge, if the terminal voltage when the discharge current is zero is lower than an open circuit voltage when the battery discharge starts, detecting the dischargeable capacity on the basis of the value which is obtained by subtracting, from the open circuit voltage when the battery discharge starts, the saturation polarization and a difference between the terminal voltage when the discharge current is zero acquired from the approximated equation and the open circuit voltage when the battery discharge starts.

In this configuration also, the dischargeable capacity free from the errors of the above difference among the characteristics and the above decrease in the dischargeable capacity can be known correctly. Further, by adding a difference between the terminal voltage when the discharge current is zero and the open circuit voltage when the battery discharge starts, the saturation polarization can be correctly known even the battery is not in an equilibrium state when the battery discharge starts.

Preferably, the method of detecting a dischargeable capacity comprises the step of:

acquiring the dischargeable capacity taking into consideration a change in a characteristic in a charging state-the open circuit voltage due to attenuation of the battery.

Therefore, the dischargeable capacity can be known taking into consideration a change in a characteristic in a charging state-the open circuit voltage due to attenuation of the battery.

The method of detecting a dischargeable capacity comprises the step of:

in each battery discharge, acquiring the dischargeable capacity on the basis of the ratio between a first change of the open circuit voltage of a new battery relative to reduction of the charging state of the battery due to the battery discharge and a second change thereof; and the value obtained by the subtraction.

In this configuration, the first change is a change in calculation of the open circuit voltage of a new battery which corresponds to the charging state attenuated by discharge. The second change is an estimated or actually measured change of the open circuit voltage of the battery which corresponds to the charging state attenuated by discharge.

If the ratio of the active material, which controls the movement of charges in an electrolyte of the battery, to water ($H_2O$) varies as compared with the state in the new battery and the degree of changing of the open circuit voltage relative to the change in the charging state is large, the ratio of the first change to the second change varies.

Therefore, by acquiring the dischargeable capacity on the basis of the ratio of the first change to the second change and the value obtained by the subtraction, the dischargeable capacity can be known taking the deactivation of the active material into consideration.

In the battery status monitoring device, preferably, the dischargeable capacity monitoring means monitors the dischargeable capacity detected by the dischargeable capacity detecting method.

In this configuration, the dischargeable capacity when the voltage drop due to polarization is saturated can be known more correctly.

The above and other objects and features of the invention will be more apparent from the following description taken in conjunction with the accompanying drawings.

DESCRIPTION OF THE PREFERRED EMBODIMENTS

Figure 1:
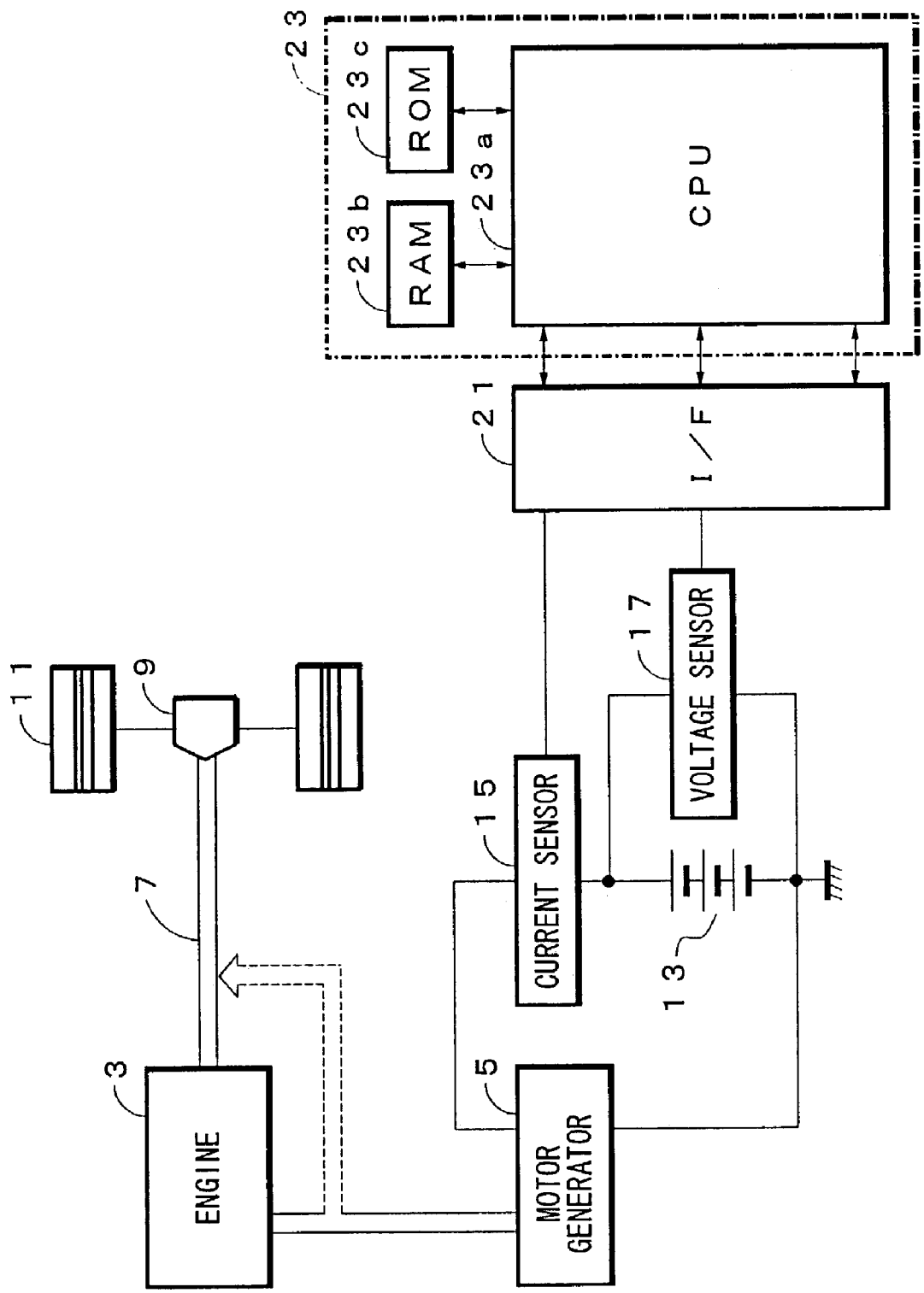
FIG. 1 is a block diagram of the battery status monitoring apparatus for implementing a saturation polarization detecting method and a dischargeable capacity detecting method.

Now referring to the drawings, an explanation will be given of a battery status monitoring apparatus, saturation polarization detecting method and dischargeable capacity detecting method according to this invention. Prior to this, referring to FIGS. 2 to 8, an explanation will be given of a method for measuring the pure resistance of a battery for a vehicle.

Figure 2:
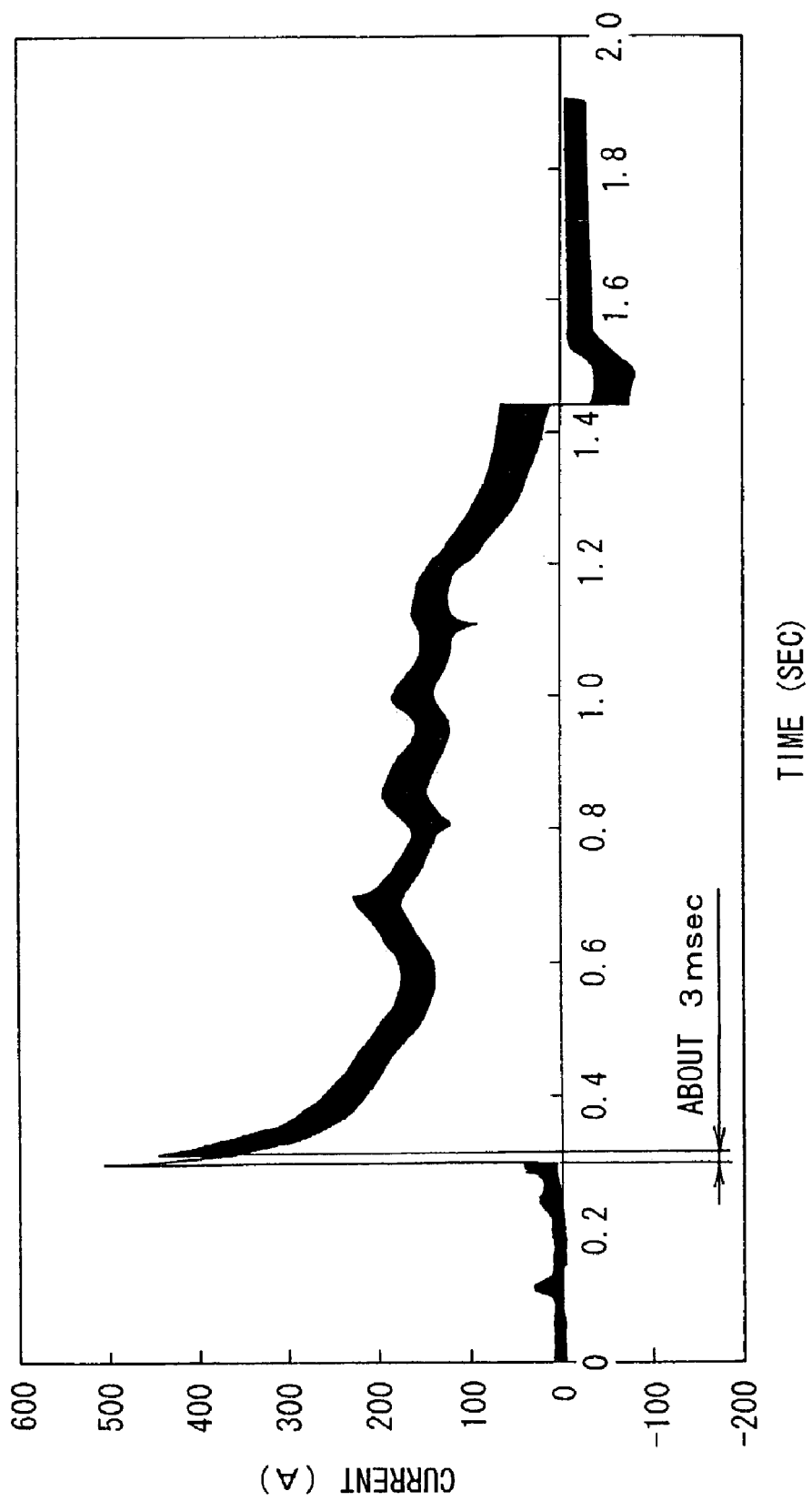
FIG. 2 is a graph showing an example of the discharged current including a rushing current when a starter motor starts to drive.

Meanwhile, as vehicle loads which operate by the power supplied from a battery, constant loads which require a large current (large current loads), such as a starter motor, motor generator, running motor, etc. are mounted on a 12-V vehicle, 42-V vehicle, a hybrid EV (electric vehicle) and EV. For example, when the large current constant load such as a starter motor is turned on, the load is supplied with a rush current at an initial stage at the start of driving and thereafter supplied with a current with a stationary value corresponding to the load.

Where a DC motor is employed as the starter motor, as shown in FIG. 2, the rush current flowing through a field coil increases monotonously from approximately zero to a peak value, e.g. 500 (A) several times as large as the stationary current in a short time of, e.g., 3 miliseconds immediately after the motor starts to drive constant load. Subsequently, the flowing current decreases monotonously from the peak value to the stationary value corresponding to the constant load in a short time of, e.g., 150 miliseconds. The current is discharged as a discharging current from the battery. Therefore, in a status where the rush current flows through the constant load, by measuring the discharge current of the battery and the corresponding terminal voltage, a discharge current (I)-terminal voltage (V) characteristic, which represents a change in the terminal voltage relative to a change in the current within a wide range from zero to the peak value, can be measured.

In order to implement this, using an electronic load, the battery was caused to carry out simulated discharge corresponding to the rush current flowing when the starter motor is turned on, i.e., the discharge during which the current increases from 0 to about 200 A for 0.25 seconds and decreases from the peak value to 0 for the same period. In this case, the pair of the discharge current and terminal voltage of the battery were measured in a short predetermined period. The pair of the acquired data were plotted with the discharge current on a horizontal axis and the terminal voltage on a vertical axis, thereby acquiring the graph of FIG. 3. The current-voltage characteristics when the discharge current increases and decreases can be approximated as the following secondary equations using the least squares method.

$$V = a1I^2 + b1I + c1 \qquad (1)$$

$$V = a2I^2 + b1I + c1 \qquad (2)$$

Figure 3:
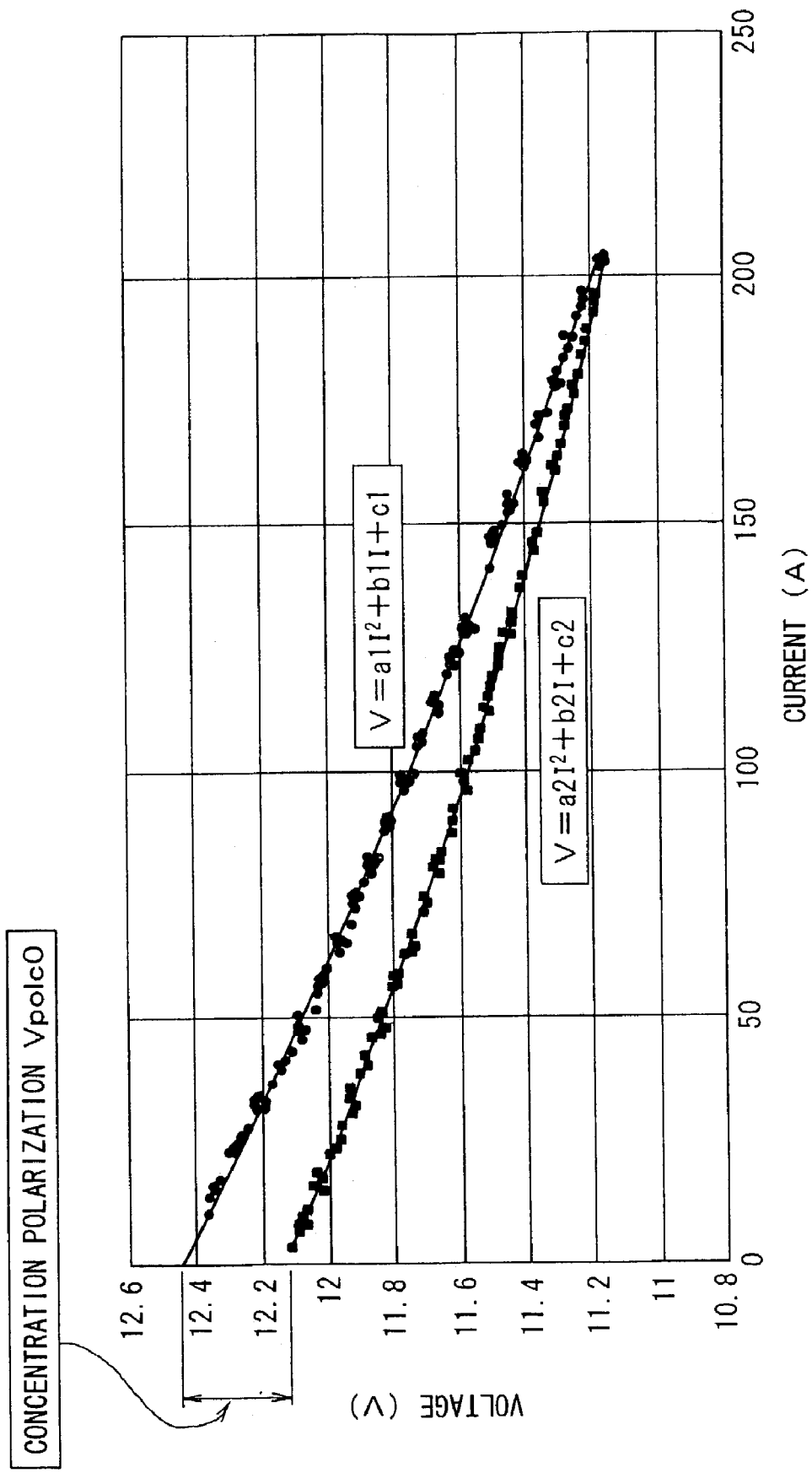
FIG. 3 is a graph showing an example of the I–V characteristic expressed by a secondary approximated equation.

In FIG. 3, curves of the secondary approximated equations are also illustrated.

In FIG. 3, the voltage difference (c1−c2) between the intercept of the approximated curve in the current increasing direction and that in the current decreasing direction, since it is that at the current 0 (A) when no current flows is that due to a concentration polarization component newly generated by discharge, which does not contain the voltage drop due to the voltage resistance and the activated polarization. The concentration polarization at the current 0 (A) is referred to as Vpolc0. Any concentration polarization can be taken as a product of a current value and time during which the current flows, i.e., is proportional to Ah (because of a short time, referred to as Asec).

An explanation will be given of a method of calculating the concentration polarization at the current peak value using the concentration polarization Vpolc0 at the current 0 (A). Now, assuming that the concentration polarization at the current peak value is Vpolcp, Vpolcp can be expressed as $$V\text{pol}cp = [(A\text{sec during a current increase})/(A\text{sec during entire discharge})] \times V\text{pol}c0 \quad (3)$$

Incidentally, Asec during the entire discharge can be expressed by $$A\text{sec during the entire discharge} = (A\text{sec during the current increase} + A\text{sec during current decrease})$$

Figure 4:
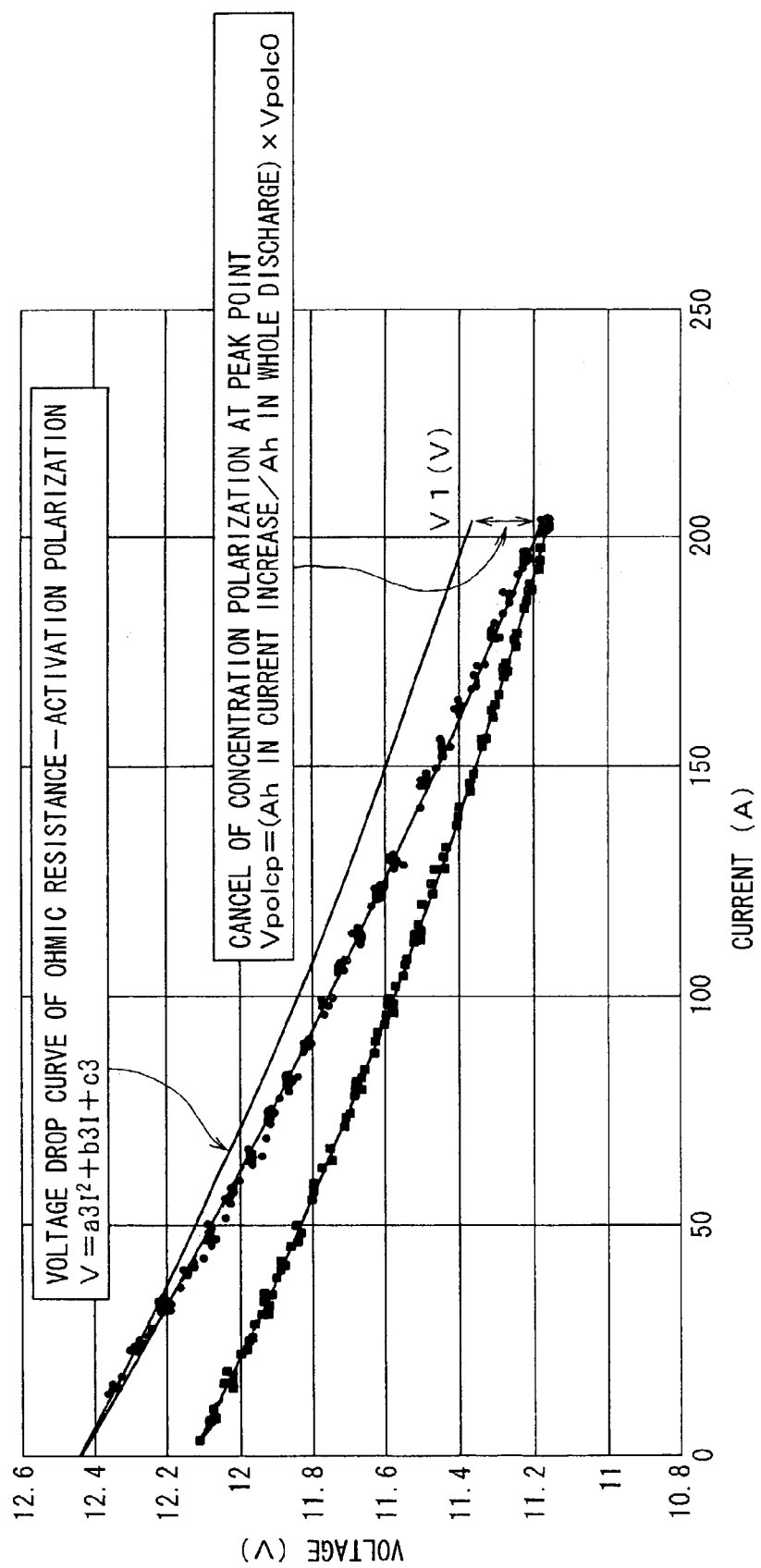
FIG. 4 is a graph for explaining a method for removing the concentration polarization component from the approximated equation in an increasing direction.
Figure 5:
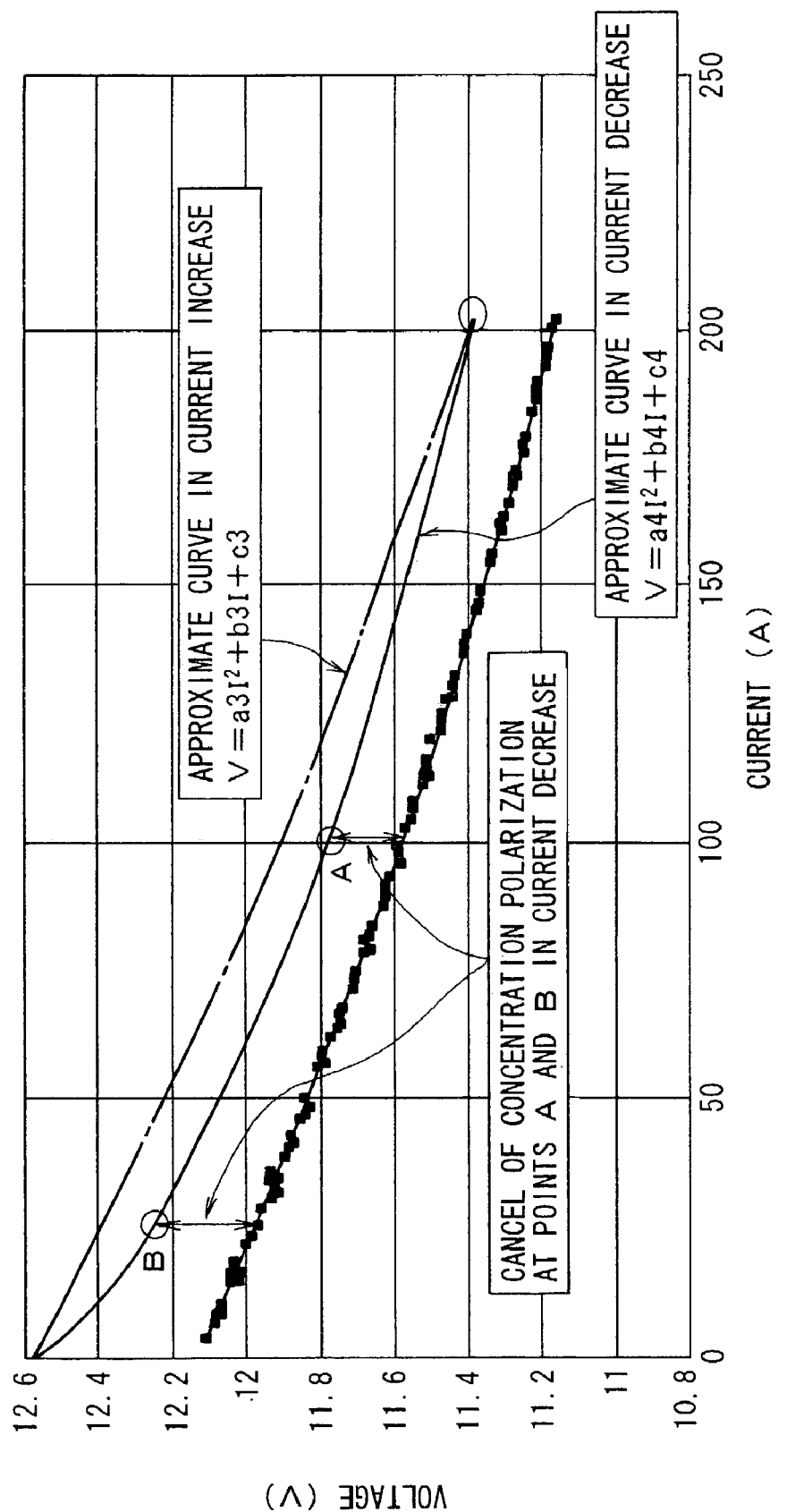
FIG. 5 is a graph for explaining a method for removing the concentration polarization component from the approximated equation in a decreasing direction.

The concentration polarization Vpolcp at the peak current value thus acquired is added to the voltage at the peak value in the direction of the current increase of Equation (1), thereby canceling the concentration polarization component at the peak value as shown in FIG. 4. The voltage V1 after the concentration polarization component at the peak value has been cancelled can be expressed as $$V1 = a1 Ip^2 + b1 Ip + c1 + V\text{pol}cp \quad (1)$$

where Ip represents the peak current value.

The approximated equation of the current-voltage characteristic due to the pure resistance and activation polarization as shown in FIG. 4 in the direction of the current increase can be expressed by $$V = a3 I^2 + b3 I + c3 \quad (4)$$

At the point of the current of 0 (A) before the discharge starts, because the activation polarization and concentration polarization are taken with respect to c1, c3=c1 from Equation (1). The current abruptly increases from the initial state. In this case, assuming that the reaction of concentration polarization is slow and the reaction does not progress so greatly, because the differentiated value of Equations (1) and (4) at the point of current 0(A) are equal to each other, b3=b1. Therefore, by substituting c3=c1 and b3=b1 into Equation (4), Equation (4) is rewritten as $$V = a3 I^2 + b1 I + c1 \quad (5)$$

Thus, the unknown value is only a3.

By substituting the coordinate (Ip, V1) of the peak value in the current increase into Equation (5), a3 can be expressed as $$a3 = (V1 - b1 Ip - c1)/Ip^2$$

Thus, the approximated equation (4) of the current-voltage due to only the pure resistance and activation polarization component can be determined by Equation (5).

Generally, because the pure resistance is not generated by a chemical reaction, it remains constant as long as the state of charge (SOC), temperature, etc., do not vary. Therefore, the pure resistance remains constant while the starter motor operates in one cycle. On the other hand, because the activation polarization resistance is generated by the chemical reaction attendant to the deliver of ions or electrons, the activation polarization resistance and the concentration polarization are influenced from each other so that the current increasing curve and the current decreasing curve of the activation polarization do not completely coincide with each other. This means that Equation (5) represents the curve in the current increasing direction of the pure resistance and the activation polarization exclusive of the concentration polarization component.

An explanation will be given of the method of removing the concentration polarization component from the current decreasing curve. The relationship between the pure resistance and the activation polarization in the current decreasing direction can be acquired in the same manner of canceling the concentration polarization at the current peak value. Assuming that two points other than the peak value are points A and B, the concentration polarization VpolcA and VpolcB at the respective points are expressed as $$V\text{pol}cA = [(A\text{sec from the start of current increase to point } A)/(A\text{sec during the entire discharge}) \times V\text{pol}c0] \quad (6)$$

$$V\text{pol}cB = [(A\text{sec from the start of current increase to point } B)/(A\text{sec during the entire discharge}) \times V\text{pol}c0] \quad (7)$$

Once the two points with the concentration polarization component other than the peak value have been determined, using three points of these two points and the peak value, the curve of the pure resistance and activation polarization in the current decreasing direction can be expressed by $$V = a4 I^2 + b4 I + c4 \quad (8)$$

Incidentally, coefficients a4, b4 and c4 in Equation (8) can be determined by solving the simultaneous equations made by substituting the current and voltage at the two points of A and B and peak point into Equation (8), An explanation will be given of the method of calculating the pure resistance of the battery.

The difference between Equation (5) (current increasing direction) and (8) (current decreasing direction) is attributable to a difference of the activation polarization component. Therefore, by removing this activation polarization component, the pure resistance can be obtained.

Meanwhile, noting the peak values of both curves where the activation polarizations have equal values, the differentiated value R1 of current increase and differentiated value R2 of current decrease can be expressed by $$R1 = 2 \times a3 \times Ip + b3 \quad (10)$$

$$R2 = 2 \times a4 \times Ip + b4 \quad (11)$$

The difference between R1 and R2 thus acquired is attributable to the fact that the one of the peak values is that in the current increasing direction and the other thereof is that in the current decreasing direction. Where the battery is caused to implement simulated discharge corresponding to the rush current using an electronic load, i.e., the discharge during which the current increases from 0 to about 200 A for 0.25 second and decreases from the peak value to 0 for the same period, it is understood that the changing rates of both differentiated values are equal in the vicinity of the peak values, and the current-voltage characteristic due to the pure resistance between both values exists. By adding both differentiated values and dividing them by 2, the pure resistance R can be acquired by $$R=(R1+R2)/2$$

(In this example, the value when both differentiated values are proportionally divided is equal to that when they are divided by 2).

The explanation has been given of the case where the the battery is caused to implement simulated discharge corresponding to the rush current using an electronic load. In the case of an actual vehicle, when a DC motor is employed as the starter motor, the current reaches the peak while the rush current flows through the field coil, and cranking operates at the current reduced to half or less of the peak current.

Therefore, in the current increasing direction, the current increase ends in a short time of 3 mili second (msec) and the concentration polarization is not almost generated at the peak value in the current increase, whereas in the current decreasing direction, the current decrease continues for a long time of 150 ms so that great concentration polarization will occur. However, it should be noted that during the cranking period, a different phenomenon from that during the period while the rush current flows has occurred so that the discharge current and terminal voltage of the battery during the cranking period are not employed as the data for determining the current-voltage in the current decreasing direction.

Figure 6:
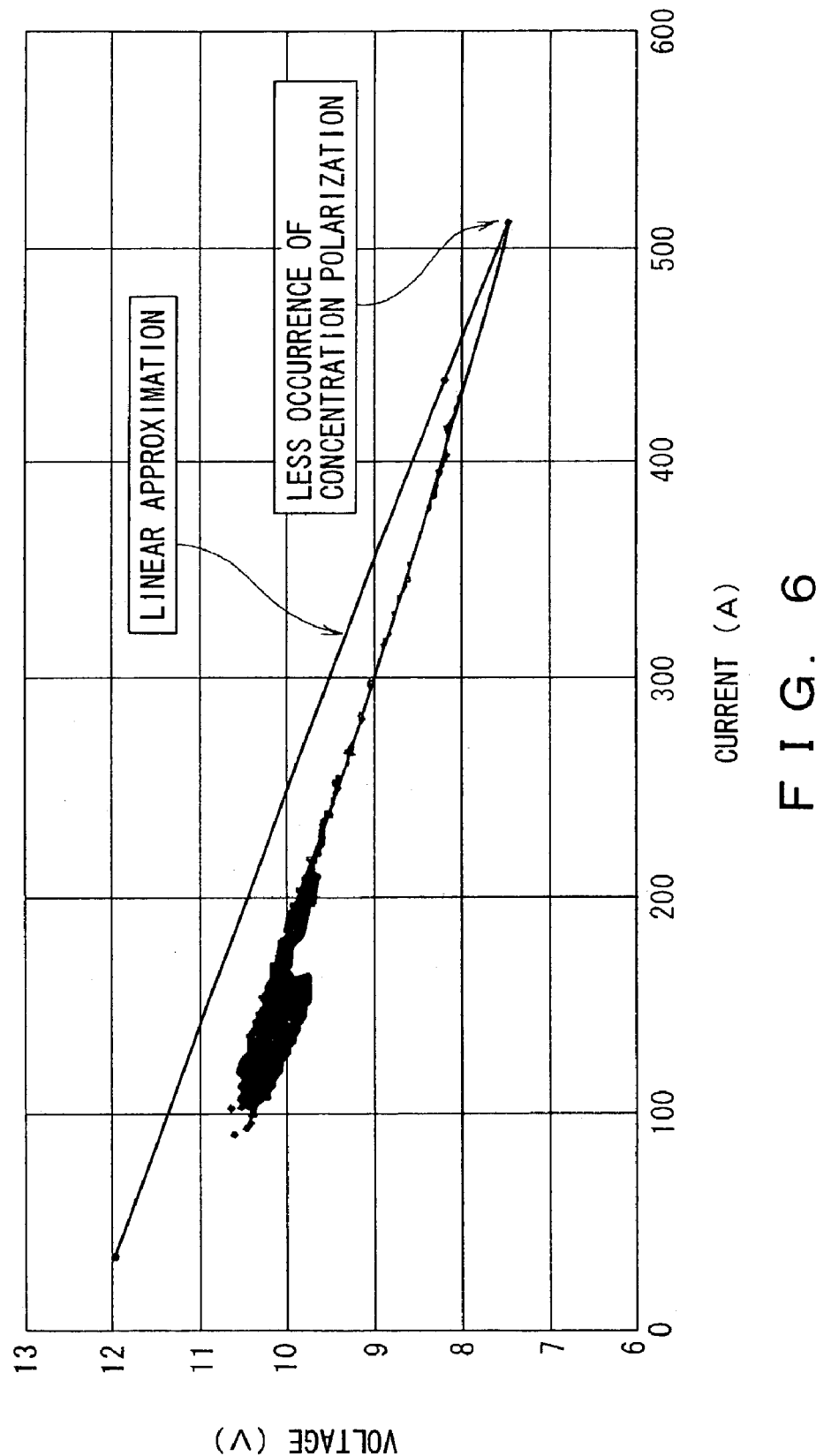
FIG. 6 is a graph showing the I–V characteristic with the increasing direction expressed by a linear approximated equation.

In the actual vehicle, as seen from FIG. 6, the curve in the current increasing direction can be approximated by a straight line connecting two points of the starting point of current increase and the peak value. The concentration polarization generated at the peak value 500 (A) can be approximated at 0 (A). In this case, in the current increasing direction, as the differentiated value at the peak value, the gradient of the approximated line in the current increasing direction is employed.

In this case, it should be noted that the gradient of the approximated line in the current increasing direction and the gradient of the tangent line at the peak of the secondary approximated equation in the current decreasing direction should not be simply subjected to additive averaging. The occurrence degrees of the activation polarization before and after the peak point is different from each other so that the premise that the both changing rates in the vicinity of the peak point are equal does not hold.

The pure resistance can be acquired by multiplying the gradient (change in two terminal voltages for a change in the unit currents at the points corresponding to the peak values in the first and the second approximated equations inclusive of the voltage drop due to the concentration polarization) by the rates of the monotonously increasing period and the monotonously decreasing period of the entire period with the rush current flowing and adding the valued thus obtained. Namely, the respective gradients are multiplied by the proportionate rates of the period of monotonous increase and monotonous decrease in the entire period and the values thus obtained are added. In this way, considering the fact that the activation polarization and concentration polarization influence each other, the pure resistance can be acquired.

Namely, theoretically, the activation polarization occurs so as to provide the value corresponding to the current value. However, the activation polarization is actually influenced by the concentration polarization so that if the concentration polarization is small, the activation polarization is also small, whereas if the concentration polarization is large, the activation polarization is also large. In any way, the pure resistance can be acquired as an intermediate value in the change in two terminal voltages for a change in the unit currents at the points corresponding to the peak values in the first and the second approximated equations inclusive of the voltage drop due to the concentration polarization.

Figure 7:
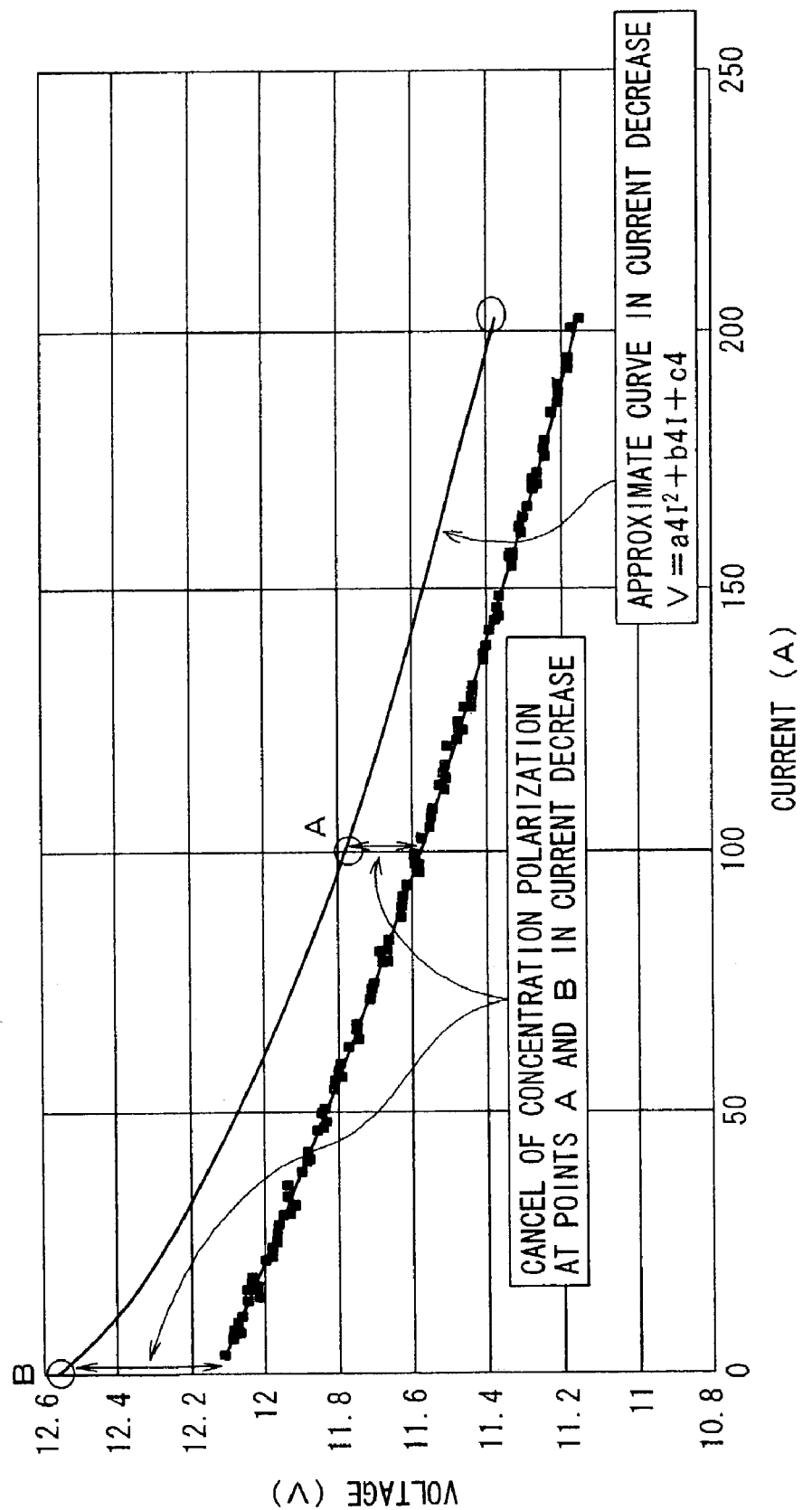
FIG. 7 is a graph showing another example of the method for removing the concentration polarization component from the approximated equation in the decreasing direction.

In many of the recent vehicles, an AC motor which requires a three-phase input, such as a DC blushless motor, has been employed. In the case of such a motor, the rush current does not reach the peak value so swiftly in a short time, but takes about 100 msec. Because the concentration polarization occurs in the current increasing direction also, as in the simulated discharge, the current changing curve in the current increasing direction must be curve-approximated.

Where the approximation for the pure resistance and activation polarization in the current decreasing direction is made, in order to define two points other than the peak value, as shown in FIG. 7, the point of current 0 (A) is used as the point B, thereby simplifying the calculation when acquiring the approximated equation.

Figure 8:
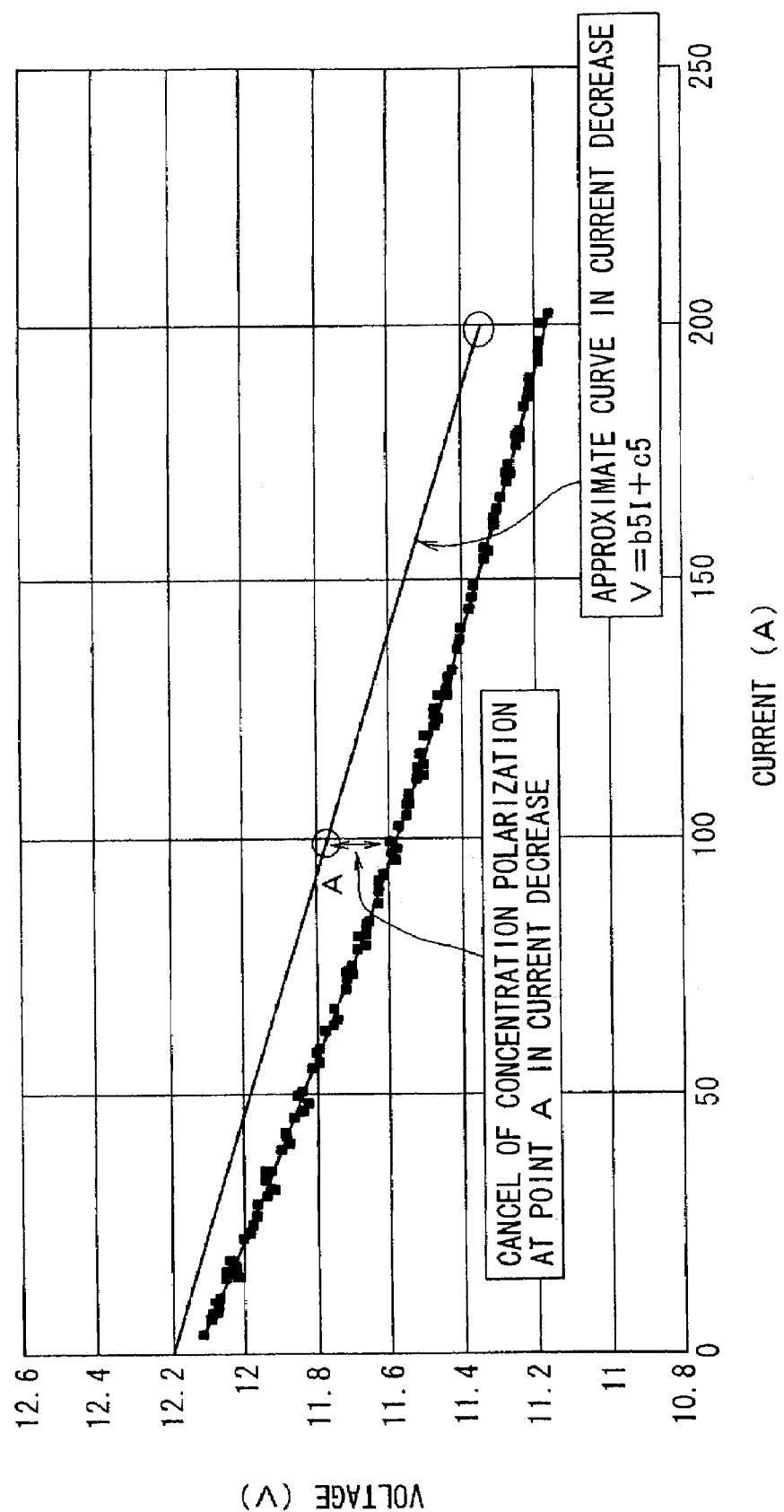
FIG. 8. is a graph showing another example of the method for removing the concentration polarization component from the approximated equation in the increasing direction.

Further, if the point corresponding to the current which is about ½ of the peak current is defined as the point with the concentration polarization cancelled, as shown in FIG. 8, linear approximation may be made at the line connecting this point and the peak value. In this case, the gradient of the approximated line in the current decreasing direction is employed as the differentiated value of the peak value, thereby providing the pure resistance with high accuracy which is equivalent to when a quadratic curve is used.

In summary, the pure resistance can be acquired as an intermediate value in the change in two terminal voltages for a change in the unit currents at the points corresponding to the peak values in the two approximated equations inclusive of the voltage drop due to the concentration polarization.

A concrete explanation will be given of an on-vehicle battery pure resistance measuring method in the case where a starter motor is employed as constant load in which the rush current accompanying the concentration polarization flows.

When the constant load is operated, a discharge current, which monotonously increases over a stationary value and monotonously decreases from a peak value to the stationary value, flows from the battery. The discharge current and terminal voltage in this case are periodically measured at intervals of e.g. 100 microseconds (μsec). Thus, a large number of pairs of the discharge current and the terminal voltage can be acquired.

The newest pairs of the discharge current and terminal voltage of the battery for a prescribed time are stored in a memory such as RAM which is a rewritable storage means. Using the pairs of the discharge current and terminal voltage stored in the memory, by the least-squares method, the two curve approximated equations expressed by Equations (1) and (2) are acquired for the current-voltage characteristics relative to the increasing current and the decreasing current which represent correlations between the discharge current and the terminal voltage. Next, the voltage drop due to the concentration polarization is cancelled from these two approximated equations, thereby acquiring curve-approximated equations exclusive of the concentration polarization component.

For this purpose, the voltage difference between the approximated equations of Equations (1) and (2) at the time of 0 (A) when no current flows is acquired as the voltage drop due to the concentration polarization, but not as that due to the pure resistance and the activation polarization.

Further, by this voltage difference, acquired is the voltage drop due to the concentration polarization component at the current peak value on the approximated equation (1) of the current-voltage characteristic relative to the increasing discharge current. In this case, used is the fact that the concentration polarization varies according to the product of the current value and the time while the current flows.

Next, assuming that both approximated equations exclusive of the concentration polarization component and the inclusive of the concentration polarization component have equal constants and first-order coefficients, the second-order coefficient of the approximated equation exclusive of the concentration polarization component is defined, thereby providing the corrected curve-approximated equation (5) of the current-voltage characteristic for the increasing discharge current.

Next, an approximated equation exclusive of the concentration polarization component is acquired from the approximated equation (2) of the current-voltage characteristic relative to the decreasing current. For this purpose, two points with the concentration polarization component cancelled other than the peak value are acquired. In this case, used is the fact that the concentration polarization varies according to the product of the current value and the time while the current flows. Thereafter, using the coordinates of three points of these two point and peak value, a modified curve-approximated equation (8) of the approximated equation (2) of the current-voltage characteristic for the decreasing discharge current is acquired.

The difference between Equation (5) (current increasing direction) and (8) (current decreasing direction) is attributable to a difference of the activation polarization component. Therefore, by removing the activation polarization component, the pure resistance can be obtained. For this purpose, noting the peak values of both approximated equations, the differentiated value of current increase and differentiated value of current decrease are acquired. The difference between both differentiated values thus acquired is attributable to the fact that the one of the peak values is that in the current increasing direction and the other thereof is that in the current decreasing direction. Because it is understood that there is the current-voltage characteristic due to the pure resistance between the changing rates of both differentiated values in the vicinity of the peak values, the pure resistance is acquired by multiplying both differentiated values by the rates of the monotonously increasing period and the monotonously decreasing period of the entire period with the rush current flowing and adding the valued thus obtained.

For example, assuming that the current increasing time is 3 msec, the current decreasing time is 100 msec, the differentiated value of current increase at the peak value is Rpolk1 and the differentiated value of current decrease at the peak value, the pure resistance Rn can be calculated as follows.

$$Rn = Rpolk1 \times 100/103 + Rpolk2 \times 3/103$$

This pure resistance Rn is calculated and updated when the high efficiency discharge accompanying the rush current, such as driving of the starter motor, is carried out.

The open circuit voltage for the on-vehicle battery in an equilibrium state of the battery is acquired as the battery terminal voltage actually measured in the equilibrium state where the influence of the polarization which has occurred by the previous charging/discharging is completely cancelled and the decrease or increase in the battery terminal voltage by the polarization disappears, or otherwise estimated by the result of observation in a short time of the change in the battery terminal voltage immediately after the charging/discharging has stopped.

Next, an explanation will be given of a method of a method of detecting a dischargeable capacity according to this invention.

The energy which the battery can discharge to the load is a capacity when the capacity corresponding to the voltage drop which occurs within the battery during the discharge (i.e. capacity which cannot be discharged by the internal resistance of the battery) is subtracted from the charged capacity (product of the current and time) corresponding to the value of the open circuit voltage of the battery.

Figure 9:
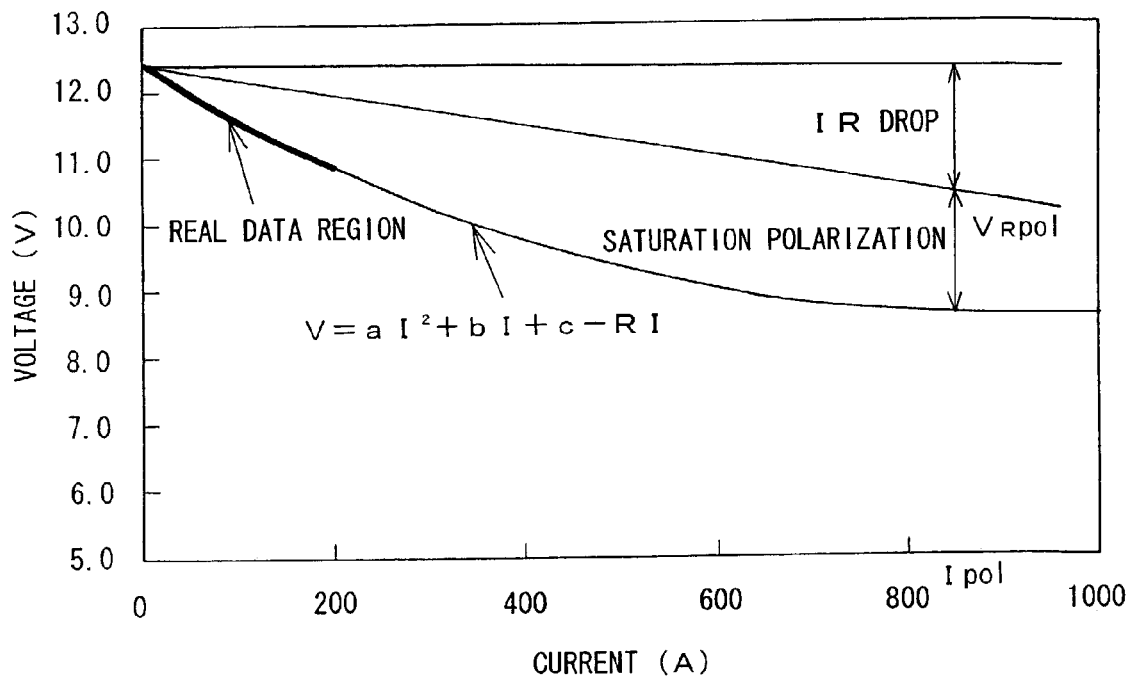
FIG. 9 is a graph for explaining the method of acquiring the saturation polarization during discharging in a state where the charging polarization occurs or an equilibrium state.

As shown in FIG. 9, the voltage drop which occurs within the battery during the discharge can be classified into the voltage drop (IR drop in FIG. 9) due to the pure resistance component of the battery and the voltage drop due to the inner resistance component other than the pure resistance, i.e., the voltage drop due to polarization (saturation polarization in FIG. 9).

The above IR drop does not change as long as the battery status remains unchanged. On the other hand, the voltage drop due to polarization increases in proportion to the discharge current and discharging time, but does not exceed the saturation polarization. Therefore, by monitoring the point which approaches the saturation polarization, the point where the voltage drop due to the internal resistance is greatest.

First, when the battery in the equilibrium state, or in the state where the discharge polarization which provides the terminal voltage is lower the open circuit voltage OCV0 at the start of discharge remains is discharged, as indicated by a bold line in FIG. 9, the approximated equation of the terminal voltage V for the discharge current I as expressed by Equation (12) is acquired by the discharge current and terminal voltage of the battery which are measured periodically during the discharge in a predetermined time (behavior of the polarization appears and within 1 sec) from the start of the discharge.

Figure 10:
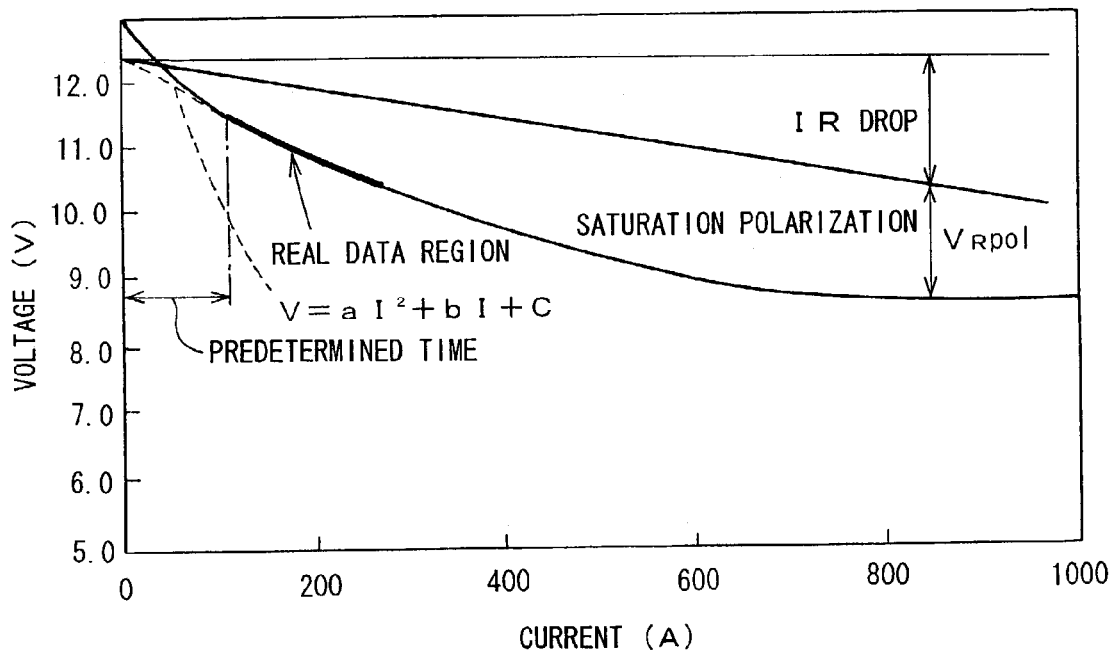
FIG. 10 is a graph for explaining the method of acquiring the saturation polarization during the discharging in a state where charging polarization occurs.

On the other hand, when the battery in the state where the charging polarization which provides the terminal voltage is higher the open circuit voltage OCV0 at the start of discharge remains is discharged, as illustrated by a bold line in FIG. 10, the approximated equation of the terminal voltage V for the discharge current I as expressed by Equation (12) is acquired from the discharge current and terminal voltage which are periodically measured during the discharge in a predetermined period when the charging polarization has almost disappeared after a predetermined time elapses from the start of the discharge. This is because the equation acquired from the discharge current and terminal voltage of the battery detected during the period when the charging polarization remains is not so highly correlated with the characteristic of the discharge current (I)-terminal voltage (V) actually acquired because of the discharge from the equilibrium state.

$$V = aI^2 + bI + c \tag{12}$$

The terminal voltage V of the battery can be expressed using the total of the voltage drop due to the pure resistance of the battery and the voltage drop $V_R$ (due to polarization) due to the internal resistance component other than the pure resistance as $$V = c - (Rn \times I + VR) \tag{13}$$

From Equations (12) and (13), the relationship between the approximated equation and the voltage drop due to the pure resistance and the voltage drop due to the polarization can be acquired by $$aI^2+bI=-(Rn\times I+V_R) \quad (14)$$

By differentiating Equation (14), the changing rate $dV_R/dI$ of the voltage drop due to the internal resistance component other than the pure resistance of the battery is acquired.

$$dV_R/dI=-2aI-b-Rn \quad (15)$$

The discharge current when the changing rate $dV_R/dI$ becomes zero corresponds to the saturation current value Ipol $(=-(Rn+b)/2a)$ when the voltage drop due to the internal resistance component other than the pure resistance component of the battery has approached the maximum value (saturation value).

In the case of the discharge from the equilibrium state, by substituting the current value Ipol in Equation (14) with the pure resistance Rn of the battery, the acquired voltage drop $V_R$ due to polarization $(=-aIpol^2-bIpol-Rn\times Ipol)$ is taken as saturation polarization $V_R$pol.

On the other hand, in the case of the discharge from the state where the charging polarization or discharging polarization remains, the above voltage drop $V_R$ and a difference between the terminal voltage c when the discharge current is zero obtained from Equation (12) and the open circuit voltage OCV0 at the start of discharge $(=-aIpol^2-bIpol-Rn\times Ipol+(OCV0-c))$ are added to provide the polarization $V_R$pol.

Figure 11:
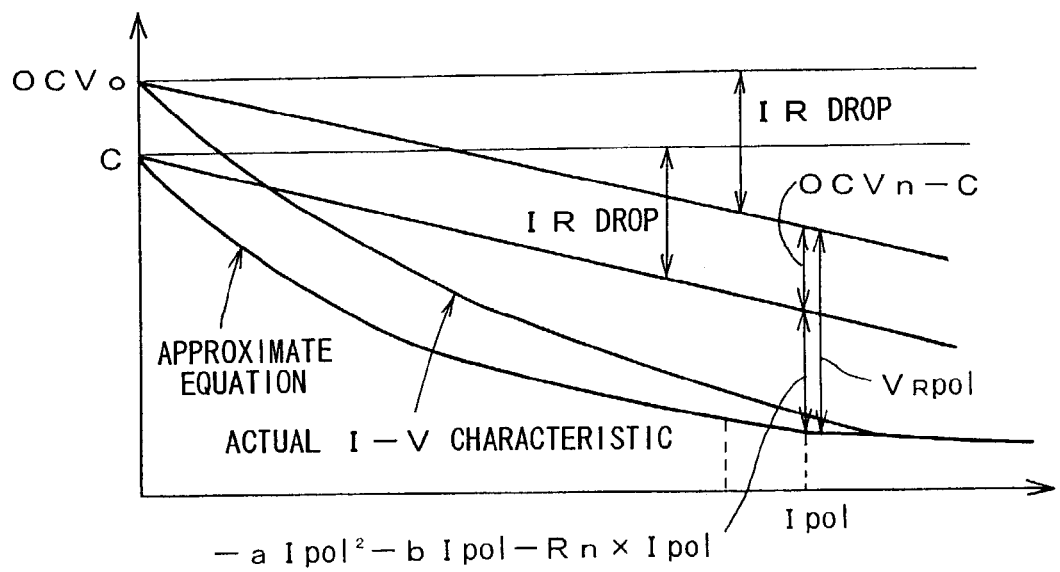
FIG. 11 is a diagram for explaining the method for acquiring the saturation polarization during the discharging in a state where the discharging polarization or charging polarization occurs.

The reason why the (OCV0−c) is added will be explained. The terminal voltage c at the discharge current of zero is acquired as shown in FIG. 11 from Equation (12) on the basis of the discharge current and terminal voltage actually measured during the predetermined period from the state where the charging polarization or discharging polarization remains. As seen from FIG. 11, the saturated value of the voltage drop in the acquired approximated equation and that of the voltage drop in the current (I)-voltage (V) characteristic are equal to each other.

Incidentally, even in the discharge in the state where the charging polarization remains, if the predetermined period is a predetermined time elapsed from the discharge, the terminal voltage c at the discharge current of zero in the approximated equation is lower than the open circuit voltage OCV0 at the start of the discharge.

In this case, the voltage drop $V_R$ $(=-aIpol^2-bIpol-Rn\times Ipol)$ due to polarization calculated by substituting Ipol in Equation (14) is the value when the drop $Rn\times Ipol$ due to the pure resistance is subtracted from the voltage drop relative to the terminal voltage c. Therefore, in order to acquire the saturation polarization Vpol (the voltage drop from OCV0−$Rn\times Ipol$), (OCV0−c) must be added to $V_R$. It should be noted that $V_R$pol can be calculated and updated.

When the discharge is made to the degree required for the battery to detect the dischargeable capacity again, the dischargeable capacity will be detected using the saturation polarization $V_R$pol as described below.

When the discharge is made, the saturation polarization $V_R$pol is acquired and the following equation will be solved $$V_{ADC}=OCV0-Rn\times IP-V_R\text{pol} \quad (16)$$

where $V_{ADC}$ represents a voltage which is an index of the present dischargeable capacity and $I_p$ represents the peak current value in this discharge.

Namely, solving Equation (16) means that the voltage drop corresponding to the pure resistance Rn and $V_R$pol are subtracted from OCV0 to provide the voltage drop $V_{ADC}$ corresponding to the present dischargeable capacity ADC.

Using $V_{ADC}$, ADC is acquired by the following conversion equation.

$$ADC=SOC\times\{(V_{ADC}-Ve)/(Vf-Ve)\}\times 100(\%)$$

where SOC=SOC×{$(V_{ADC}-Ve)/(Vf-Ve)$}×100(%), Vf represents a fully charged voltage and Ve represents a discharge stopping voltage.

Figure 13:
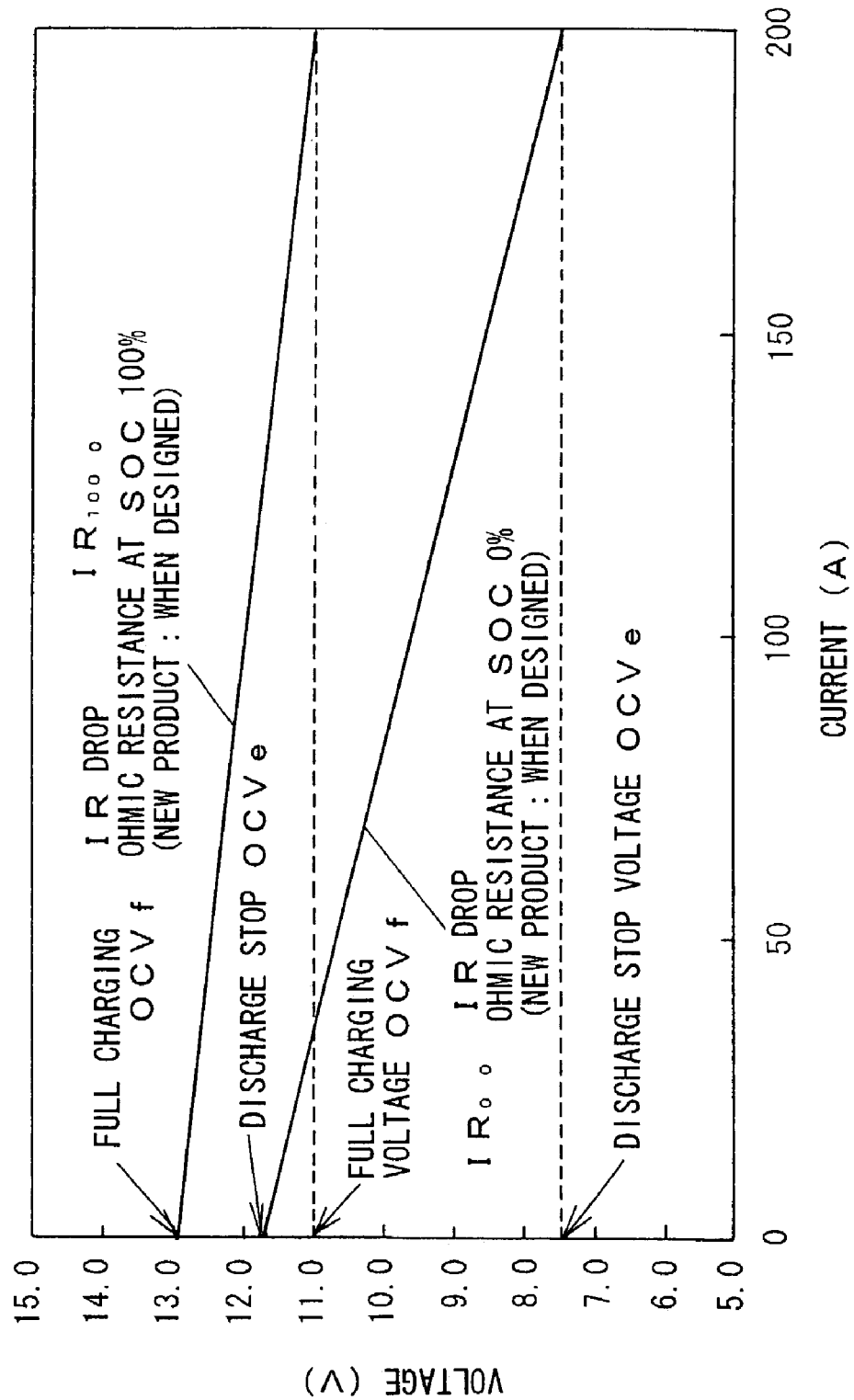
FIG. 13 is a graph showing the full-charging voltage and discharging stopping voltage of a battery.

As seen from FIG. 13, Vf can be acquired by $$Vf=OCVf-Rnf0\times Ip$$

where OCVf represents the open circuit voltage OCVf when the battery is fully charged (SOC: State of Charge=100%) and Rnf0 represents the pure resistance at SOC=100.

The discharge final voltage Ve of the battery can be acquired by $$Ve=OCVe-Rne0\times Ip$$

where OCVe represents the open circuit voltage when the battery has been fully discharged (SOC=0%), and Rneo represents the pure resistance at SOC=0%.

Further, ADC can be acquired using $V_{ADC}$ by the following conversion equation $$ADC=SOC\times\{(V_{ADC}-OCVe)/(OCV0-Rne0\times Ip-OCVe)\}\times 100\%$$

The voltage drop corresponding to the pure resistance Rn reflects the difference among the characteristics of individual batteries, and the present polarization $V_R$pol of the battery reflects a decrease in the dischargeable capacity ADC due to continues flowing of the discharge current and a change in the internal resistance to be attributed to a temperature change.

Therefore, the acquired ADC does not have above reflections as an error and hence is a correct ADC.

The voltage drop due to the internal resistance at the peak current during the discharge, i.e. when the voltage drop due to the pure resistance of the internal resistance component other than polarization can be known.

Figure 14:
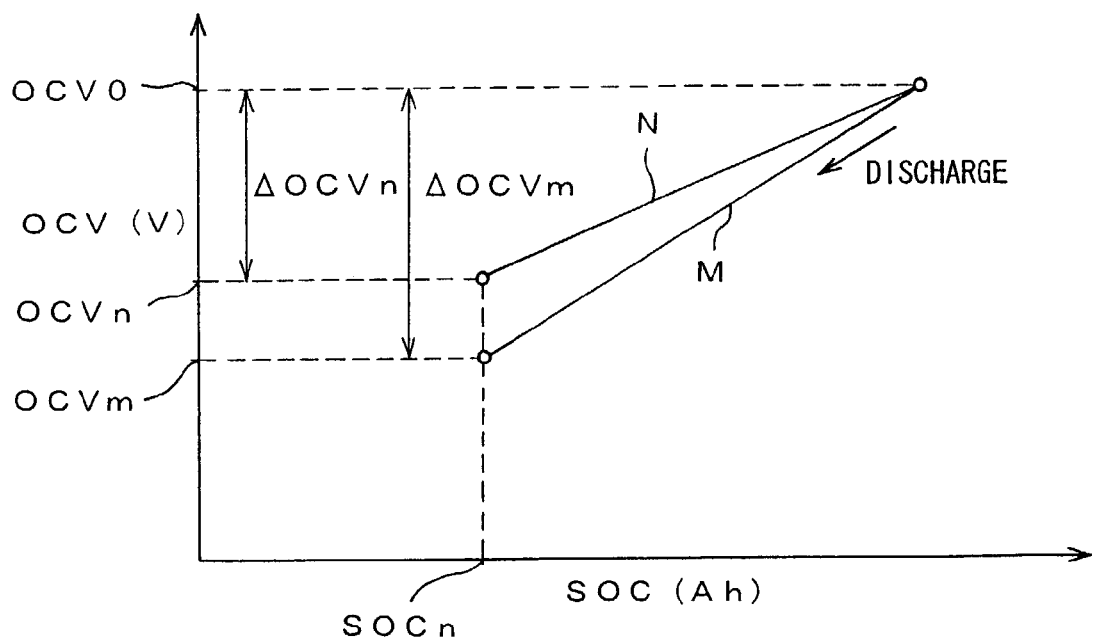
FIG. 14 is a graph for calculating a dischargeable capacity considering deterioration
Figure 12:
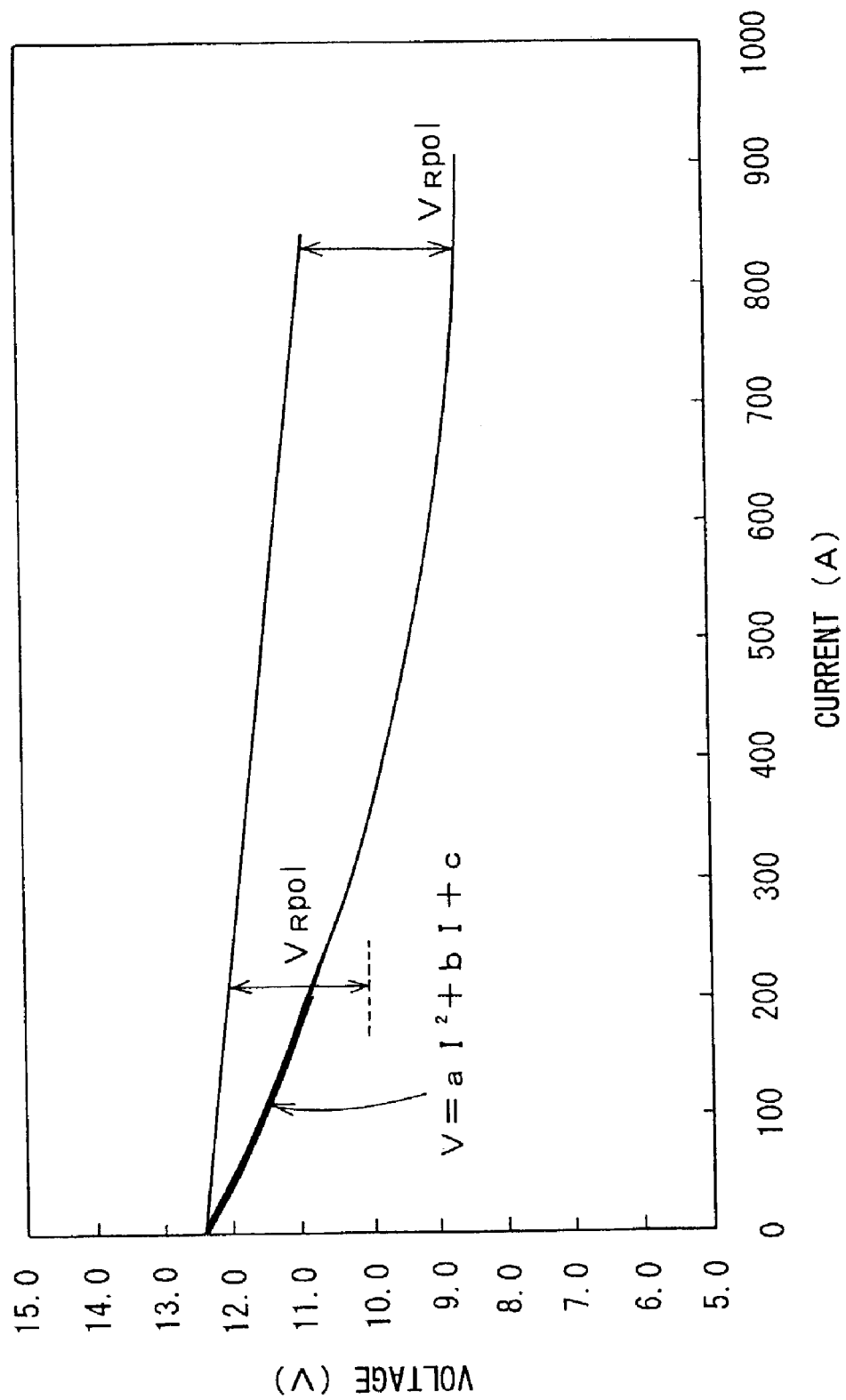
FIG. 12 is a graph for explaining the contents of the voltage drop which occurs within the battery during the discharging.

As seen from FIG. 14, when the discharge is made from the battery with OCV0, in the new product of the battery, the open circuit voltage decreases along a segment N as the discharge advances and reaches OCVn when the discharge stops, i.e. any quantity of charges is discharged. On the other hand, in an attenuated battery, the open circuit voltage decreases along a segment M and reaches OCVm when the same quantity of charges is discharged.

Generally, even when the discharge is repeated, the charging state SOC can be estimated by the product of a current and time. This can be calculated by accumulating the current-time products during the discharge using the following equation.

SOC0 immediately before the discharge−Σ (discharging current×time)

By the above equation, even while the battery is discharged, SOC of the battery can be always estimated.

As described above, the estimated SOCn is always acquired during the charging/discharging. When the discharge is stopped, the final SOCn at this time is estimated. The estimated value is converted into the estimated OCVn. These SOCn and OCVn are acquired on the basis of the initial quantity of electricity which is a total quantity between the open circuit voltage when fully charged, which is previously determined for a new product of battery, and a discharge stopping voltage.

A change ΔOCVn (=OCV0−estimated OCVn) which is a difference between the open circuit voltage OCV0 before the discharge and the above estimated OCVn represents a change in calculation of the open circuit voltage of the new product of battery for the attenuation of the charging state of the battery due to discharging.

On the other hand, a change ΔOCVm (=OCVm−estimated OCVn) which is a difference between the open circuit voltage OCV0 before the discharge and OCVm estimated or measured after the discharge represents a change in the open circuit voltage of the battery at issue for the attenuation of the charging state of the battery due to discharging.

Regardless of whether the state is in an equilibrium state or not, the dischargeable capacity ADC can be acquired more correctly by the following conversion equation.

$$ADC=\{(V_{ADC}-Ve)/(Vf-Ve)\} \times (\Delta OCVn/\Delta OCVm) \times 100 \text{ (\%), or}$$

$$ADC=SOC \times \{(V_{ADC}-OCVe)/(OCVn-Rne0 \times Ip-OCVe)\} \times (\Delta OCVn/\Delta OCVm) \times 100\%.$$

In this equation, it should be noted that the right side is multiplied by (ΔOCVn/ΔOCVm). This conversion equation permits a more correct dischargeable capacity to be acquired taking into consideration the change in the open circuit voltage corresponding to the change in the charging state due to possible deactivation of the active material of the battery.

Incidentally, the conversion equation for acquiring ADC from $V_{ADC}$ may not be changed to deal with the change in the rate of the quantity of the active material in the battery to $H_2O$.

In the above explanation, in the discharging from the state from the state where the charging polarization or discharging polarization remains, the value of the voltage drop $V_R$(=−aIpol2−bIpol−Rn×Ipol) plus (OCV0−c) has been taken as the saturation polarization. However, regardless with the state, the above $V_R$ may be taken as the saturation polarization and (OCV0−c) may be added at the time of calculating $V_{ADC}$.

The method of calculating a dischargeable capacity for the on-vehicle battery and battery status monitoring method can be implemented by the arrangement as shown in FIG. 1.

FIG. 1 is a block diagram of an embodiment of the battery status monitoring device for implementing the method of detecting saturation polarization, the method of calculating a dischargeable capacity for the on-vehicle battery and battery status monitoring method.

As shown in FIG. 1, an on-vehicle battery status monitoring device 1 is mounted on a hybrid vehicle which includes an engine 3 and motor generator 5.

As for the hybrid vehicle, in its normal operation, only the output power from the engine 3 is transmitted to a wheel 11 by way of a drive shaft 7 and differential case 9 so that the vehicle travels, while in its high load operation, the motor generator 5 functions as a motor with an electric power from a battery 13 such as a lead battery, transmitting the output power from the motor generator 5 in addition to the output power from the engine 3 to the wheel 11 by way of the drive shaft 7 so that the vehicle attains an assist traveling.

Further, as for the hybrid vehicle, the motor generator 5 functions as a generator upon deceleration or braking so that the kinetic energy is transformed into the electric energy, thereby charging the battery 13.

Further, the motor generator 5 is used as a starter motor for forcibly rotating a flywheel of the engine 3 upon starting of the engine 3 accompanied with switching on of a starter switch (not shown).

The battery status monitoring device 1 includes a current sensor 15, which detects the discharge current I of the battery 13 with regard to electric equipment such as a motor for assist traveling and a motor generator 5 serving as a starter motor and the charging current from the motor generator 5, and a voltage sensor 17, which detects a terminal voltage V of the battery 13, having a resistance of about 1 M ohm, which is connected in parallel with the battery 13.

The current sensor 15 and voltage sensor 17 are arranged on the circuit which falls into the closed circuit state according to the on-state of an ignition switch.

The device 1 also includes a microcomputer 23, into which the output from the current sensor 15 and voltage sensor 17 are taken after A/D conversion in an interface circuit (hereinafter, I/F) 21.

The microcomputer 23 includes a CPU 23a, RAM 23b and ROM 23c, in which the CPU 23a is connected to the I/F 21 as well as to the RAM 23b and ROM 23c, and supplied with a signal indicative of the on/off state of the ignition switch not shown.

The RAM 23b has a data area for storing various data and a work area for use in various kinds of processing. A control program to make the CPU 23a carry out various kinds of processing is installed in the ROM 23c.

Thus, when the microcomputer 23 carries out various detections on the basis of the output from the output of the current sensor 15 and voltage sensor 17, the voltage drop due to the internal resistance when the polarization of the battery 13 is saturated and ADC are detected and monitored. Therefore, it can be seen that the microcomputer 23 serves as an internal resistance.

As understood from the description hitherto made, because the voltage drop due to the internal resistance at the time when the voltage drop is the highest and the dischargeable capacity can be known, the battery status can be known correctly.

In the embodiments described above, the voltage drop due to the internal resistance at the time when the voltage drop is saturated is acquired and the voltage drop thus acquired is subtracted from the open circuit voltage of the battery to provide ADC. However, without acquiring ADC, the voltage drop and saturation polarization are only added to monitor the internal resistance at the time when the voltage drop is saturated.

Incidentally, the contents of Japanese Patent Appln. Nos. 02-137820 filed on May 13, 2002 and 03-097567 filed on Mar. 31, 2003 are hereby incorporated by reference.

What is claimed is:

1. A battery status monitoring device comprising:
an internal resistance monitoring means for monitoring a voltage drop due to an internal resistance when a drop in the terminal voltage due to polarization occurring during battery discharge is saturated,
wherein said internal resistance monitoring means monitors a sum of a voltage drop due to a pure resistance of the battery when a peak current is flowing during the battery discharge and a saturated value of the drop in the terminal voltage due to polarization.

2. A battery status monitoring device comprising:
a dischargeable capacity monitoring means for monitoring a dischargeable capacity, which is obtained by subtracting a voltage drop due to an internal resistance when a drop in the terminal voltage due to polarization occurring during discharge of a battery is saturated from an open circuit voltage corresponding to a chargeable capacity of the battery, wherein said dischargeable capacity monitoring means monitors said dischargeable capacity on the basis of a value which is obtained by subtracting, from said open circuit voltage, a voltage drop due to a pure resistance of the battery when a peak current is flowing during the battery discharge and a saturated value of said drop in the terminal voltage.

3. A method of detecting a saturation polarization representative of a saturated value of a drop in the terminal voltage due to polarization occurring during battery discharge, comprising the steps of:

detecting the saturation polarization on the basis of an approximated equation of the terminal voltage for a discharge current, which is acquired from a discharge current and terminal voltage of said battery detected during a predetermined period in the battery discharge, and a pure resistance of said battery;

differentiating a relationship between said approximated equation and the voltage drops by said pure resistance and by polarization with respect to said discharge current, thereby acquiring an equation of a change of said voltage drop due to polarization relative to said discharge current; acquiring, from said equation of a change, the discharge current when said change becomes zero as a terminal voltage drop saturated current value of said battery; and substituting said discharged current thus acquired in the relationship to provide said voltage drop due to polarization to be detected as said saturation polarization.

4. A method of detecting a saturation polarization representative of a saturated value of a drop in the terminal voltage due to polarization occurring during battery discharge, comprising the steps of:

detecting the saturation polarization on the basis of an approximated equation of the terminal voltage for a discharge current, which is acquired from a discharge current and terminal voltage of said battery detected during a predetermined period in the battery discharge, and a pure resistance of said battery;

acquiring, from the approximated equation of the terminal voltage, the terminal voltage when the discharge current is zero;

if said terminal voltage when the discharge current is zero is lower than an open circuit voltage when the battery discharge starts, differentiating a relationship between said approximated equation and the voltage drops by said pure resistance and by polarization with respect to said discharge current, thereby acquiring an equation of a change of said voltage drop due to polarization relative to said discharge current;

acquiring, from said equation of a change, the discharge current when said change becomes zero as a terminal voltage drop saturated current value of said battery; and substituting said discharge current thus acquired in the relationship to provide said voltage drop due to polarization and adding, to said voltage drop, a difference between said terminal voltage when the discharge current is zero and the open circuit voltage when the battery discharge starts, thereby detecting the added value as said saturation polarization.

5. A method of detecting a saturation polarization according to claim 3, wherein in said relationship, the terminal voltage in said approximated equation is represented by a sum of the voltage drops due to the pure resistance and polarization.

6. A method of detecting a saturation polarization representative of a saturated value of a drop in the terminal voltage due to polarization occurring during battery discharge, comprising the steps of:

detecting the saturation polarization on the basis of an approximated equation of the terminal voltage for a discharge current, which is acquired from a discharge current and terminal voltage of said battery detected during a predetermined period in the battery discharge, and a pure resistance of said battery; and in the case of the battery discharge when charging polarization has occurred, acquiring the approximated equation of the terminal voltage relative to the discharge current on the basis of the discharge current and terminal voltage detected during a predetermined period after a prescribed time elapses from when the battery discharge has started.

7. A battery status monitoring device comprising an internal resistance monitoring means for monitoring a voltage drop due to an internal resistance when a drop in the terminal voltage due to polarization occurring during battery discharge is saturated, wherein said internal resistance monitoring means detects the voltage drop due to the internal resistance acquired on the basis of the saturation polarization detected by a method for detecting saturation polarization representative of a saturated value of a drop in the terminal voltage due to polarization occurring during battery discharge, the method comprising the step of:

detecting the saturation polarization on the basis of an approximated equation of the terminal voltage for a discharge current, which is acquired from a discharge current and terminal voltage of said battery detected during a predetermined period in the battery discharge, and a pure resistance of said battery.

8. A dischargeable capacity detecting method for detecting a dischargeable capacity of the battery using a saturation polarization of the battery detected by a saturation polarization detecting method comprising the step of:

in each battery discharge, acquiring said dischargeable capacity on the basis of a value which is obtained by subtracting a voltage drop due to a pure resistance of the battery and said saturation polarization from the open circuit voltage when the battery discharge starts, wherein the method of detecting the saturation polarization detects the saturation polarization representative of a saturated value of a drop in the terminal voltage due to polarization occurring during battery discharge, the method comprising the step of:

detecting the saturation polarization on the basis of an approximated equation of the terminal voltage for a discharge current, which is acquired from a discharge current and terminal voltage of said battery detected during a predetermined period in the battery discharge, and the pure resistance of said battery.

9. A dischargeable capacity detecting method for detecting a dischargeable capacity of the battery using the saturation polarization of the battery detected by the saturation polarization detecting method according to claim 6, comprising the step of:

in each battery discharge, if said terminal voltage when the discharge current is zero is lower than an open circuit voltage when the battery discharge starts, detecting the dischargeable capacity on the basis of the value which is obtained by subtracting, from the open circuit voltage when the battery discharge starts, said saturation polarization and a difference between the terminal voltage when the discharge current is zero acquired from the approximated equation and the open circuit voltage when the battery discharge starts.

10. A method of detecting a dischargeable capacity according to claim 8, comprising:
acquiring said dischargeable capacity taking into consideration a change in a characteristic in a charging state-said open circuit voltage due to attenuation of said battery.

11. A method of detecting a dischargeable capacity according to claim 10, comprising the step of:
in each battery discharge, acquiring the dischargeable capacity on the basis of the ratio between a first change of the open circuit voltage of a new battery relative to reduction of the charging state of the battery due to the battery discharge and a second change thereof; and said value obtained by said subtraction.

12. A battery status monitoring device comprising a dischargeable capacity monitoring means for monitoring a dischargeable capacity, which is obtained by subtracting a voltage drop due to an internal resistance when a drop in the terminal voltage due to polarization occurring during discharge of a battery is saturated from an open circuit voltage corresponding to a chargeable capacity of the battery, wherein said dischargeable capacity monitoring means monitors the dischargeable capacity detected by the dischargeable capacity detecting method according to claim 11.

13. A battery status monitoring device comprising:
an internal resistance monitoring means for monitoring a voltage drop due to an internal resistance when a drop in the terminal voltage due to polarization occurring during battery discharge is saturated,
wherein said internal resistance monitoring means monitors a sum of a voltage drop due to a pure resistance of the battery when a current is flowing during the battery discharge and a saturated value of the drop in the terminal voltage due to polarization.

14. A battery status monitoring device comprising:
a dischargeable battery capacity monitoring means for monitoring a dischargeable capacity, which is obtained by subtracting a voltage drop due to an internal resistance when a drop in the terminal voltage due to polarization occurring during discharge of a battery is saturated form an open circuit voltage corresponding to a chargeable capacity of the battery,
wherein said dischargeable capacity monitoring means monitors said dischargeable capacity on the basis of a value which is obtained by subtracting, from said open circuit voltage, a voltage drop due to a pure resistance of the battery when a current is flowing during the battery discharge and a saturated value of said drop in the terminal voltage.

* * * * *